(12) United States Patent
Chen et al.

(10) Patent No.: US 9,054,524 B2
(45) Date of Patent: *Jun. 9, 2015

(54) BI-DIRECTIONAL BIPOLAR JUNCTION TRANSISTOR FOR HIGH VOLTAGE ELECTROSTATIC DISCHARGE PROTECTION

(71) Applicant: Macronix International Co., Ltd., Hsinchu (TW)

(72) Inventors: Hsin-Liang Chen, Taipei (TW); Shuo-Lun Tu, Hsinchu (TW)

(73) Assignee: MACRONIX INTERNATIONAL CO., LTD. (TW)

( * ) Notice: Subject to any disclaimer, the term of this patent is extended or adjusted under 35 U.S.C. 154(b) by 337 days.

This patent is subject to a terminal disclaimer.

(21) Appl. No.: 13/656,232

(22) Filed: Oct. 19, 2012

(65) Prior Publication Data

US 2014/0111890 A1    Apr. 24, 2014

(51) Int. Cl.
*H01L 29/47*      (2006.01)
*H02H 7/09*       (2006.01)
*H02H 9/04*       (2006.01)
*H01L 27/02*      (2006.01)
*H01L 29/74*      (2006.01)

(52) U.S. Cl.
CPC . *H02H 7/09* (2013.01); *H02H 9/04* (2013.01); *H01L 27/0262* (2013.01); *H01L 29/7436* (2013.01)

(58) Field of Classification Search
USPC .................................................. 257/119–182
See application file for complete search history.

(56) References Cited

U.S. PATENT DOCUMENTS

| | | | |
|---|---|---|---|
| 5,545,909 A | 8/1996 | Williams et al. | |
| 8,664,690 B1 * | 3/2014 | Chen et al. | 257/107 |
| 2005/0230761 A1 | 10/2005 | Imahashi et al. | |
| 2006/0223269 A1 * | 10/2006 | Honma | 438/294 |
| 2009/0225482 A1 * | 9/2009 | Nakahara | 361/56 |
| 2011/0186909 A1 * | 8/2011 | Tsai et al. | 257/173 |
| 2012/0086080 A1 * | 4/2012 | Chen et al. | 257/355 |

* cited by examiner

*Primary Examiner* — Matthew W Such
*Assistant Examiner* — Ali Naraghi
(74) *Attorney, Agent, or Firm* — Alston & Bird LLP

(57) ABSTRACT

A bi-directional electrostatic discharge (ESD) protection device may include a substrate, an N+ doped buried layer, an N-type well region and two P-type well regions. The N+ doped buried layer may be disposed proximate to the substrate. The N-type well region may encompass the two P-type well regions such that a portion of the N-type well region is interposed between the two P-type well regions. The P-type well regions may be disposed proximate to the N+ doped buried layer and comprise one or more N+ doped plates and one or more P+ doped plates.

19 Claims, 9 Drawing Sheets

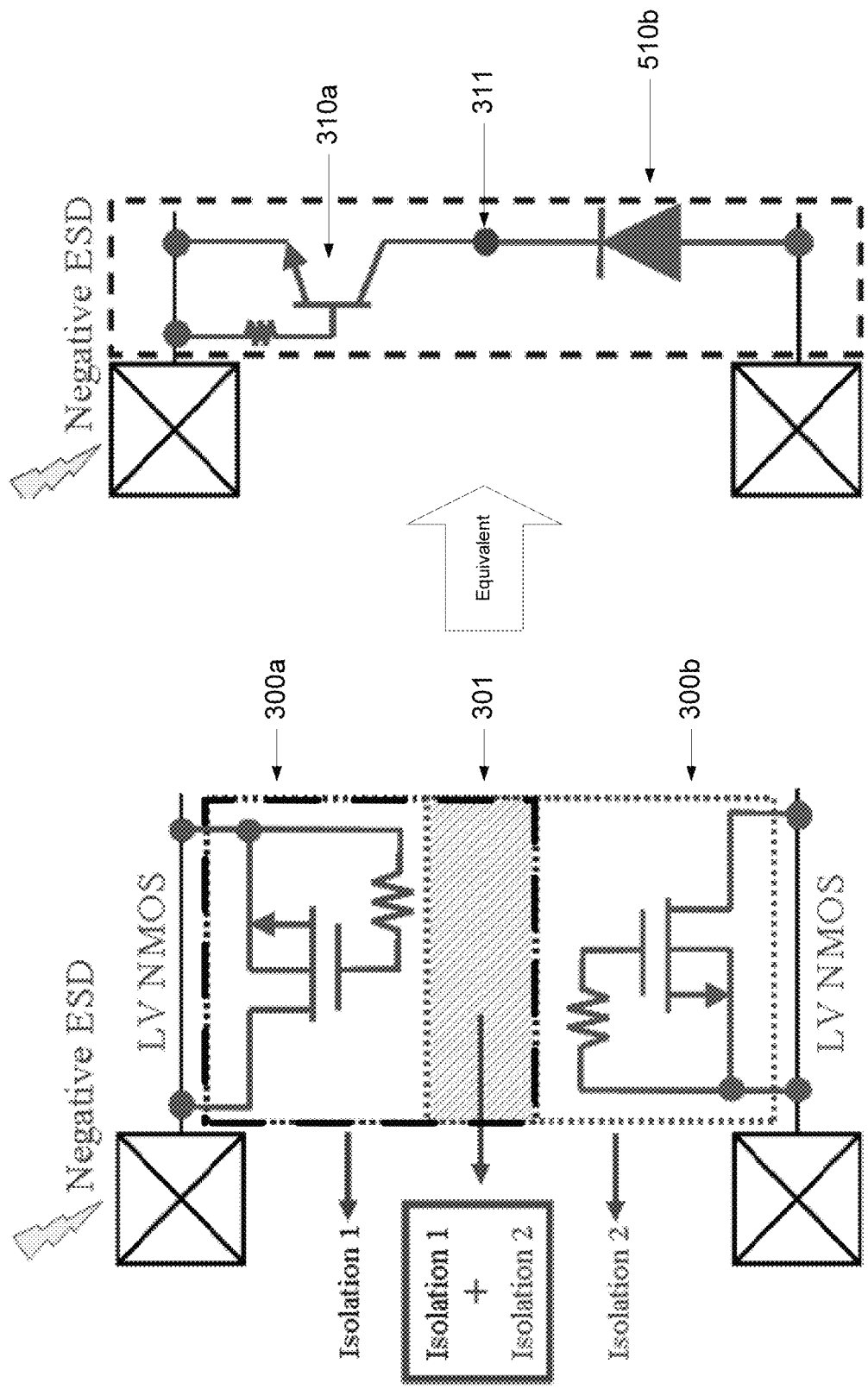

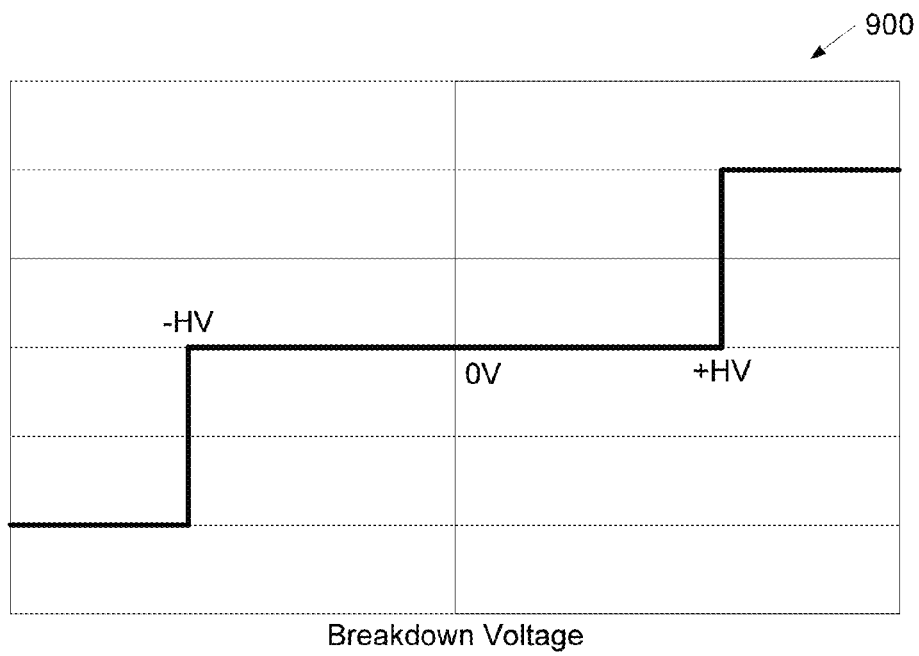
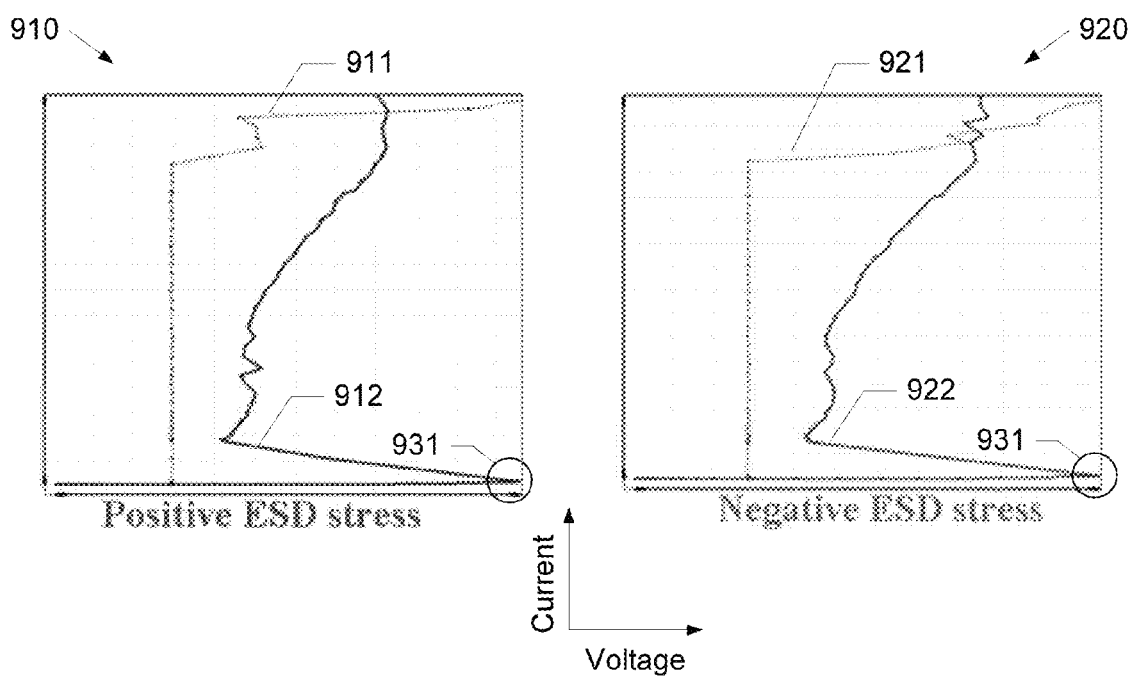
Figure 9

BI-DIRECTIONAL BIPOLAR JUNCTION TRANSISTOR FOR HIGH VOLTAGE ELECTROSTATIC DISCHARGE PROTECTION

TECHNOLOGICAL FIELD

Embodiments of the present invention generally relate to semiconductor devices and, more particularly, relate to a bi-directional bipolar junction transistor (BJT) for high voltage electrostatic discharge (ESD) protection.

BACKGROUND

There is currently an ongoing drive toward the downscaling of device dimensions in virtually all aspects of electronic device manufacture. Smaller electronic devices tend to be more popular than larger, more bulky devices when both devices have substantially equivalent capabilities. Accordingly, being able to fabricate smaller components would clearly tend to facilitate the production of smaller devices that incorporate those components. However, many modern electronic devices require electronic circuitry to perform both actuation functions (e.g., switching devices) and data processing or other decision making functions. The use of low voltage complementary metal-oxide-semiconductor (CMOS) technologies for these dual functions may not always be practical. Thus, high voltage (or high power) devices have also been developed to handle many applications where low voltage operation is not practical.

The electrostatic discharge (ESD) performance of typical high voltage devices often depends on the total width and surface or lateral rules of the corresponding devices. Thus, ESD performance may typically be more critical for smaller devices. High voltage devices typically have characteristics that include a low on-state resistance (Rdson), a high breakdown voltage and a low holding voltage. The low on-state resistance may tend to make an ESD current more likely to concentrate on the surface or the drain edge of a device during an ESD event. High current and high electric fields may cause the physical destruction at a surface junction region of such a device. Based on the typical requirement for a low on-state resistance, the surface or lateral rules likely cannot be increased. Thus, ESD protection may be a challenge.

The high breakdown voltage characteristic of high voltage devices typically means that the breakdown voltage is higher than the operating voltage, and the trigger voltage (Vt1) is higher than the breakdown voltage. Accordingly, during an ESD event, the internal circuitry of the high voltage device may be at risk of damage before the high voltage device turns on for ESD protection. The low holding voltage characteristic of high voltage devices also leaves open the possibility that unwanted noise associated with a power-on peak voltage or a surge voltage may be triggered or that a latch-up may occur during normal operation. High voltage devices may also experience the field plate effect due to the fact that electric field distribution may be sensitive to routing so that ESD current may be likely to concentrate at the surface or drain edge during an ESD event.

To improve high voltage device performance with respect to ESD events, one technique that has been implemented involves the additional use of masks and other processes to create a larger sized diode within bipolar junction transistor (BJT) components and/or increasing the surface or lateral rules for MOS transistors. Silicone controlled rectifiers (SCRs) have also been developed to protect circuitry during ESD events. However, while the low holding voltage of SCRs means they may perform well during ESD events, this characteristic also increases the occurrence of latch-up during normal operation.

Motor driver circuits may be particularly troublesome to protect from ESD events using current solutions. This is because when a motor is switched off, it may continue spinning for some time, thus acting as an inductor which feeds back a high negative voltage. If the motor driver circuitry were to include a PMOS, the parasitic forward bias diode of the PMOS may be turned on by this negative feedback voltage, potentially causing latch-up issues and/or other irregular circuit operation.

Accordingly, it may be desirable to develop an improved structure for providing ESD protection and, in particular, for providing bi-directional ESD protection.

BRIEF SUMMARY OF EXEMPLARY EMBODIMENTS

Some example embodiments are therefore directed to a low voltage structure bi-directional bipolar junction transistor (BJT) for high voltage electrostatic discharge (ESD) protection. In some cases, the ESD protection may be provided at least in part based on modifications to a BCD (Bipolar Complimentary metal-oxide semiconductor (BiCMOS) Diffusion metal-oxide semiconductor (DMOS)) process that may involve an epitaxial process.

In one exemplary embodiment, a bi-directional BJT is provided ("exemplary" as used herein referring to "serving as an example, instance or illustration"). The bi-directional BJT may include a p-type substrate, an N+ doped buried layer, an N-type well region and two P-type well regions. The N+ doped buried layer may be disposed adjacent to the substrate. The N-type well region may be disposed adjacent to the N+ doped buried layer and encompassing the first and second P-type well regions such that a portion of the N-type well region is interposed between the first and second P-type well regions. The P-type well regions may be disposed adjacent to the N+ doped buried layer and each may respectively comprise one or more N+ doped plates and one or more P+ doped plates.

According to a further embodiment, the P-type well regions comprise three N+ doped plates, two P+ doped plates, and two gate structures. For each P-type well, the three N+ doped plates, two P+ doped plates, and two gate structures may be configured such that a first P+ doped plate is disposed adjacent to a first N+ doped plate, a first gate structure is interposed between the first and a second N+ doped plate, a second gate structure is interposed between the second and a third N+ doped plate, and a second P+ doped plate is disposed adjacent to the third N+ doped plate.

In another exemplary embodiment, a circuit is provided which comprises a bi-directional high voltage ESD protection element. The bi-directional high voltage ESD protection element comprises a p-type substrate, an N+ doped buried layer, an N-type well region and two P-type well regions. The N+ doped buried layer may be disposed adjacent to the substrate. The N-type well region may be disposed adjacent to the N+ doped buried layer and encompassing the first and second P-type well regions such that a portion of the N-type well region is interposed between the first and second P-type well regions. The P-type well regions may be disposed adjacent to the N+ doped buried layer and each may respectively comprise one or more N+ doped plates and one or more P+ doped plates. The P-type well regions may comprise three N+ doped plates, two P+ doped plates, and two gate structures. For each P-type well, the three N+ doped plates, two P+ doped plates, and two gate structures may be configured such that a first P+ doped plate is disposed adjacent to a first N+ doped plate, a first gate structure is interposed between the first and a second N+ doped plate, a second gate structure is interposed between the second and a third N+ doped plate, and a second P+ doped plate is disposed adjacent to the third N+ doped plate.

According to yet another exemplary embodiment, a semiconductor device is provided which comprises a first isolated low voltage n-channel metal oxide field effect transistor (LVNMOS) and a second isolated LVNMOS, the first and second isolated LVNMOS sharing a common N-type well isolation region.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIGS. 1a and 1b respectively illustrate a simplified diagram of a prior art SCR and its associated electrical characteristics;

FIGS. 2a and 2b respectively illustrate a simplified diagram of an embodiment of the present invention and its associated electrical characteristics;

FIGS. 5a and 5b illustrate the circuit representations depicted in FIGS. 2a and 2b under negative ESD stress;

FIG. 9 illustrates breakdown voltage characteristics and experimental electrical characteristics of an example embodiment.

DETAILED DESCRIPTION

Some example embodiments of the present invention will now be described more fully hereinafter with reference to the accompanying drawings, in which some, but not all embodiments of the invention are shown. Indeed, various example embodiments of the invention may be embodied in many different forms and should not be construed as limited to the example embodiments set forth herein; rather, these example embodiments are provided so that this disclosure will satisfy applicable legal requirements.

Figure 1A:
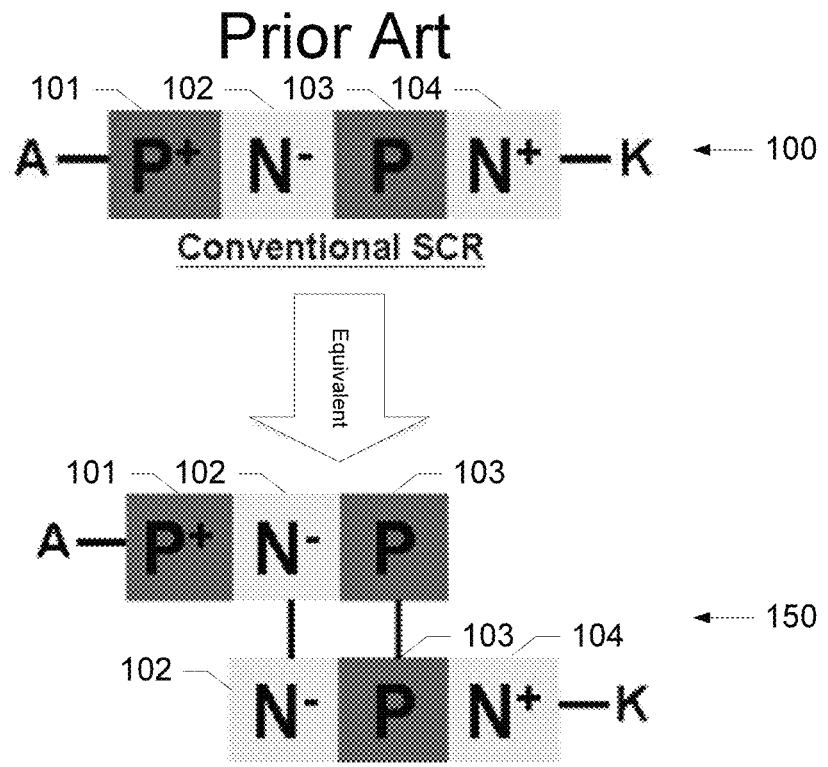
Figure 1B:
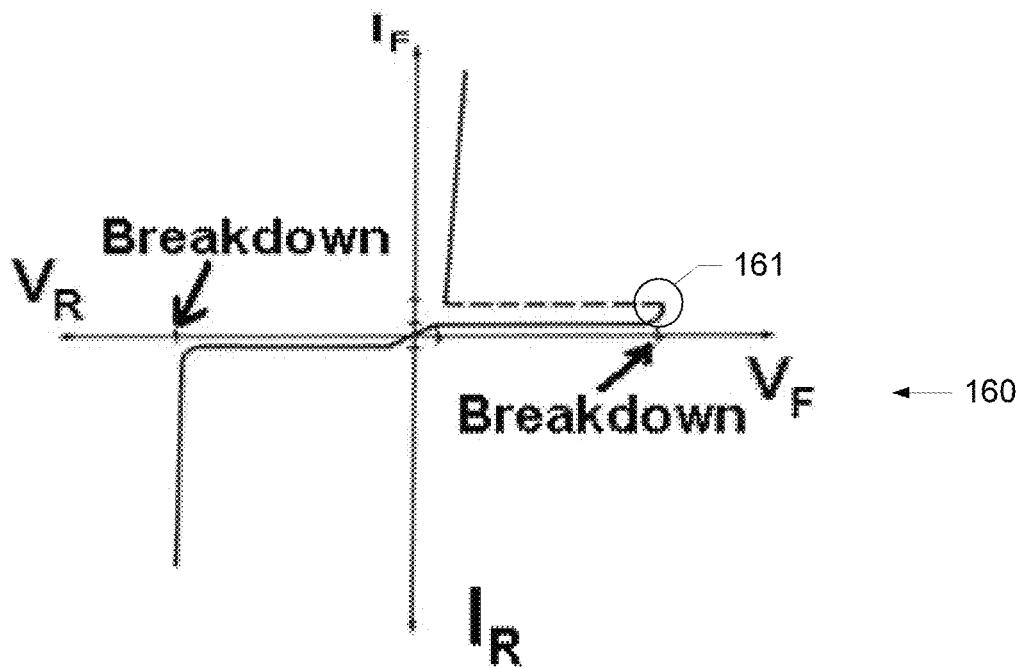

Some example embodiments of the present invention may provide a bi-directional BJT that may, for example, be used for bi-directional high voltage ESD protection, e.g., protection for positive and negative voltage ESD. The bi-directional BJT of example embodiments may combine two isolation low voltage N-channel metal oxide semiconductor transistors (MOS) into one ESD protection device, thus providing a structure having a total area smaller than a diode—BJT and MOS, while providing similar ESD performance in two directions. Example embodiments may also have a breakdown voltage that is near the high voltage device operation voltage and a trigger voltage that is lower than the high voltage device breakdown voltage. Furthermore, a relatively high holding voltage may be provided to more easily avoid latch-up occurrence than with a silicon controlled rectifier (SCR). Example embodiments may, for example, be useful in motor driver circuits, such as connected between an I/O pad and power pad. In this case, example embodiments may provide positive and negative high voltage ESD protection without causing irregularities during normal operation and without introducing latch-up issues. Example embodiments may also be fabricated, in some cases, with a standard BCD process that does not require the addition of an increased number of masks or processes. The polysilicon used in some example embodiments may, for example, be provided via a hard mask at ion implantation FIG. 1a illustrates a simplified diagram of a conventional SCR 100. As shown, a conventional SCR consists of a P+ material 101 adjacent to an N− material 102, which is in turn adjacent to a P-type material 103 that is itself adjacent to an N+ material 104. An electrically-equivalent diagram 102 is also depicted. As shown in the graph 160 of FIG. 1b, a conventional SCR provides ESD protection in the forward direction, as illustrated by the snap-back 161 which occurs at the forward breakdown voltage.

Figure 2A:
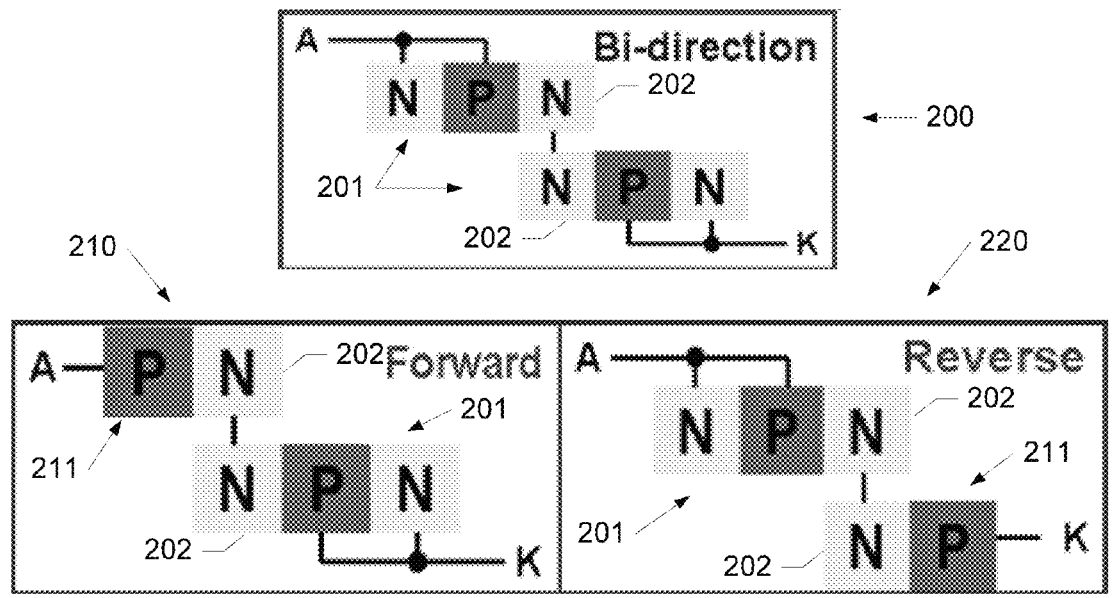
Figure 2B:
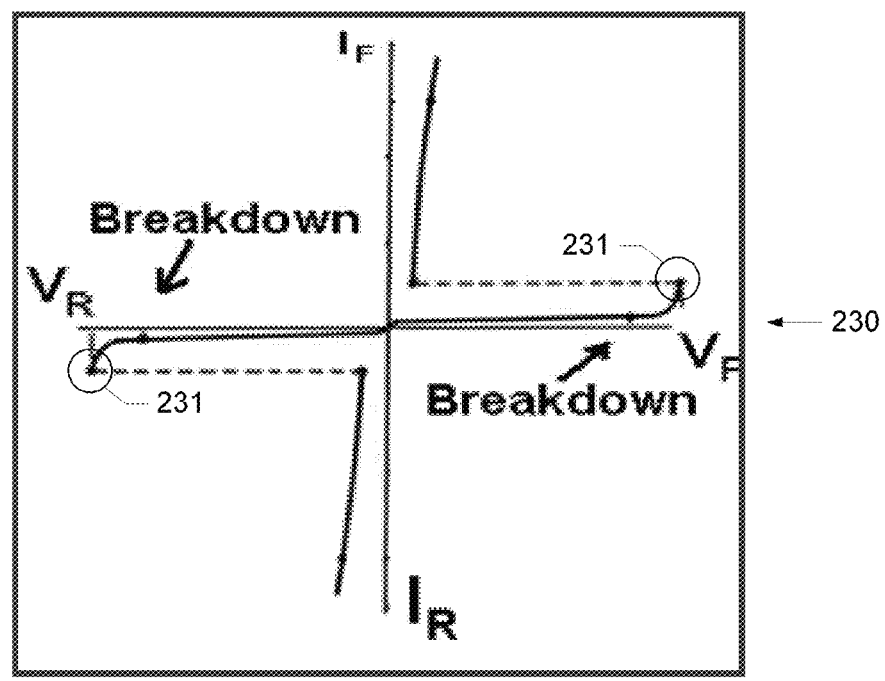

FIG. 2a illustrates a simplified diagram of an embodiment of the present invention. As shown in view 200, embodiments of the present invention may operate as two NPN bipolar transistors 201 having coupled N-type regions 202. Thus, as can be seen in views 210 and 220, example embodiments may function so as to be triggered by a forward bias diode 211, then turn-on an NPN BJT 212 to snap-back, in both forward 210 and reverse 220 directions. The graph 230 illustrates the aforementioned forward and reverse snap-backs 231. Example embodiments may have low on-resistance (Ron) and high holding voltage, and high ESD current may be discharged by the forward bias diode and NPN BJT at the same time.

Figure 3B:
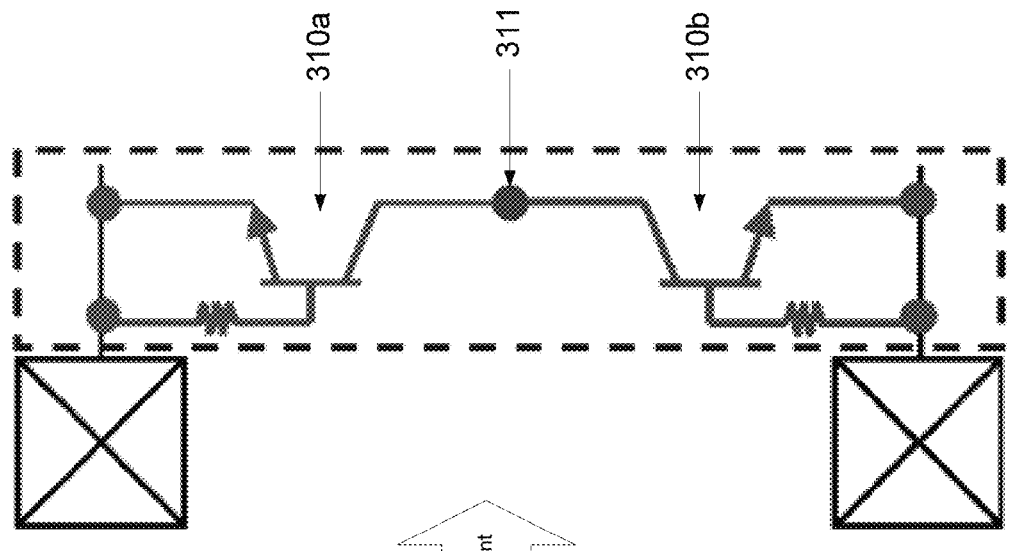
FIGS. 3a and 3b illustrate electrical circuits having electrical properties roughly equivalent to an embodiment of the present invention.
Figure 3A:
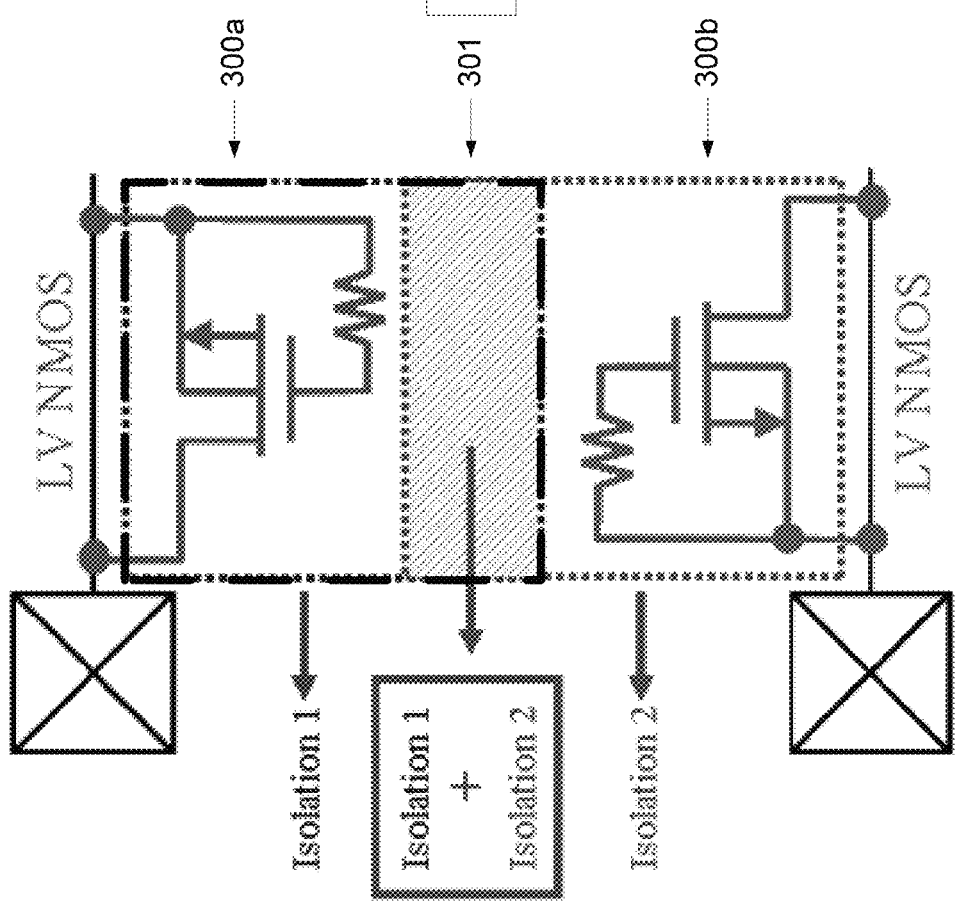
Figures 4A, 4B:
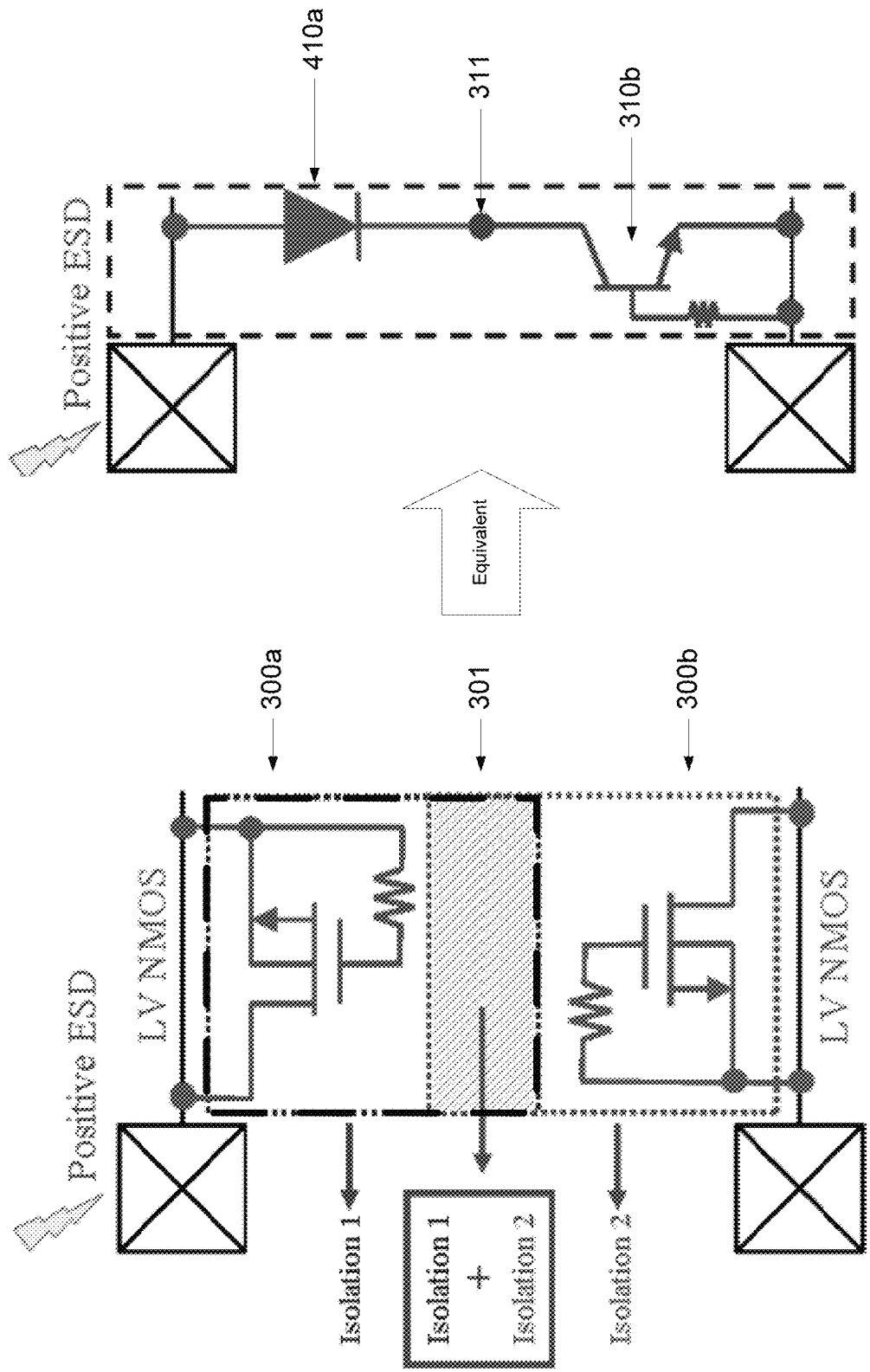
FIGS. 4a and 4b illustrate the circuit representations depicted in FIGS. 2a and 2b under positive ESD stress.

FIGS. 3a and 3b illustrate simplified circuit diagram representations of an embodiment of the present invention. As can be seen in FIG. 3a, embodiments of the present invention may comprise two low voltage isolation NMOSs 300a, 300b sharing a common isolation region 301. As shown in FIG. 3b, the electrical properties of embodiments of the present invention may be modeled as two BJT transistors 310a, 310b with coupled collectors 311. As can be seen in FIGS. 4a and 4b, under positive ESD stress, the top BJT transistor 310a instead operates as a forward bias diode 410a. As can be seen in FIGS. 5a and 5b, under negative ESD stress, the bottom BJT transistor 310a instead operates as a forward bias diode 510b. Thus, whether positive ESD or negative ESD stress is applied, embodiments of the present invention may ensure ESD current is discharged, thus providing bi-directional ESD protection. The forward and reverse breakdown voltages of example embodiments may be made the same or different by using isolation NMOS or NPN BJTs having the same or different breakdown voltage.

Figure 6:
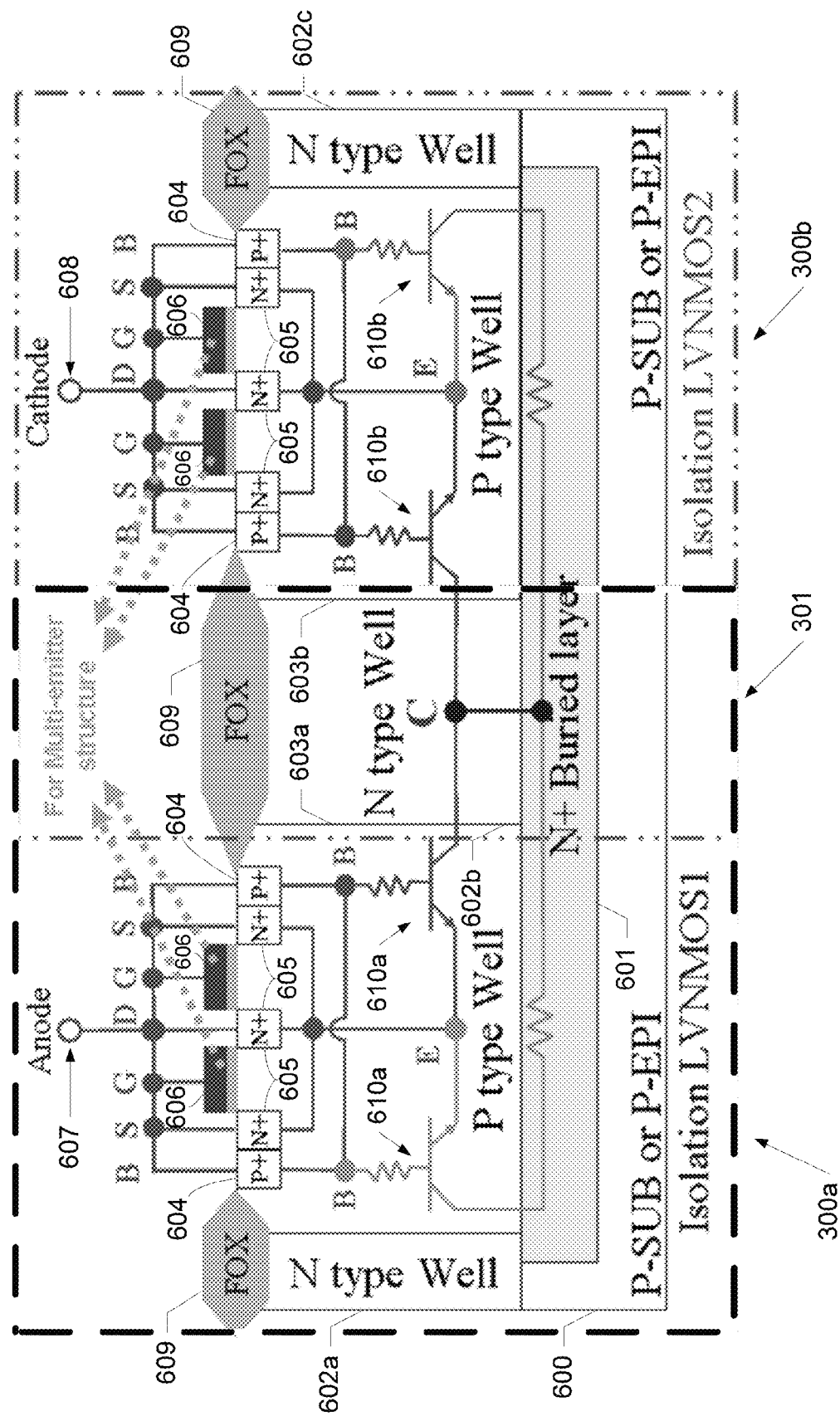
FIG. 6 illustrates a cross-sectional view of the structure of an example embodiment.
Figure 7:
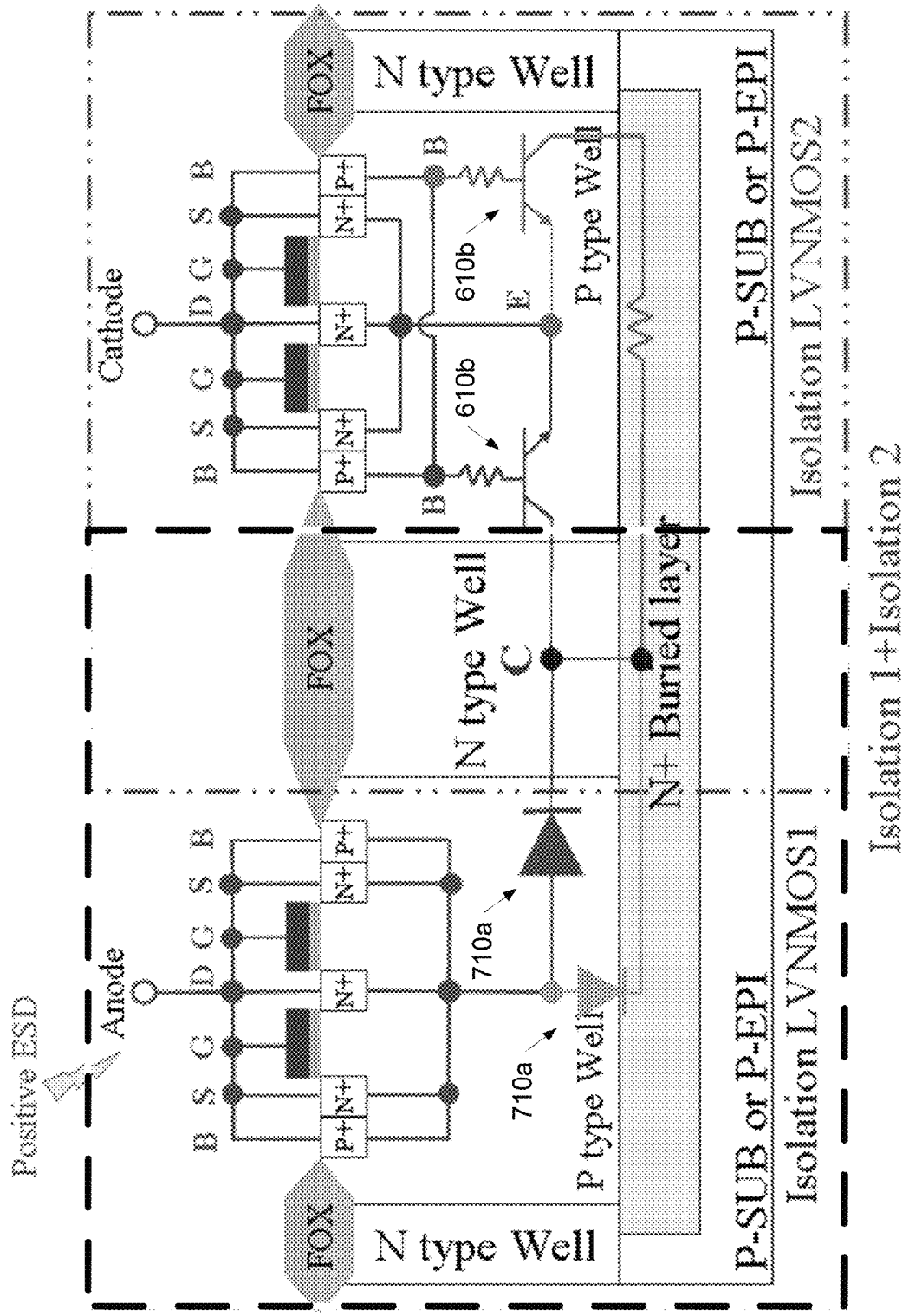
FIG. 7 illustrates a cross-sectional view of the structure of an example embodiment under positive ESD stress.
Figure 8:
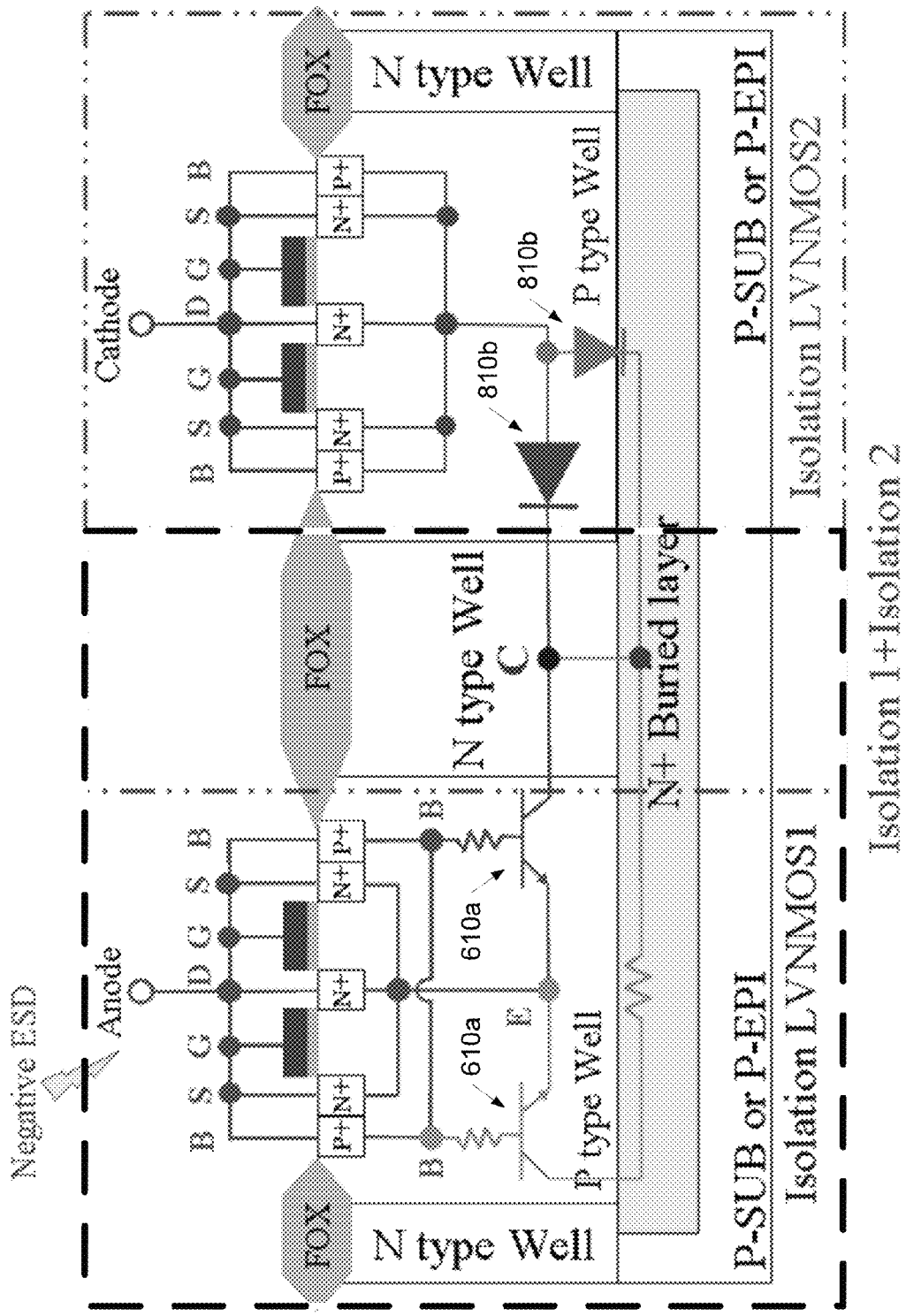
FIG. 8 illustrates a cross-sectional view of the structure of an example embodiment under negative ESD stress.

Having thus described generally the electrical characteristics and properties of example embodiments of the present invention, reference will now be directed to FIGS. 6 through 8 in order to describe the structure of an example embodiment.

FIG. 6 illustrates a cross-sectional view of an example embodiment for providing bi-directional high voltage ESD protection. As can be seen from FIG. 6, a P-type material substrate 600 or an epitaxially-grown P-layer (P-epi) may be provided with an N+ buried layer 601 disposed adjacent thereto. An N-type well 602a-c may be disposed adjacent to the N+ buried layer 601 and encompassing first and second P-type wells 603a, 603b such that a portion 602b of the N-type well over is disposed between the first and second P-type wells 603a, 603b. The N-type well 602a-c may be a single contiguous well according to some embodiments or, according to another embodiment, may comprise two or more separate N-type wells. The outer portions of the N-type well 602a, 602c may be in contact with the P-type substrate 600 according to an example embodiment. The first and second P-type wells 603a, 603b may comprise at least one P+ doped plate 604 and at least one N+ doped plate 605.

For example, according to the example embodiment depicted in FIG. 6, the first and second P-type wells 603a, 603b may each comprise two P+ doped plates 604, three N+ doped plates 605, and two gate structures 606. Thus, as shown, the first P-type well 603a may comprise a first P+ doped plate 604 that may be disposed adjacent to a first N+ doped plate 605, a first gate structure 606 that may be interposed between the first and a second N+ doped plate 605, a second gate structure 606 that may be interposed between the second and a third N+ doped plate 605, and a second P+ doped plate that may be disposed adjacent to a third N+ doped plate. Similarly, the second P-type well 603b may comprise a third P+ doped plate 604 that is disposed adjacent to a fourth N+ doped plate 605, a third gate structure that is interposed between the fourth and a fifth N+ doped plate 605, a fourth gate structure that is interposed between the fifth and a sixth N+ doped plate 605, and a fourth P+ doped plate 604 that is disposed adjacent to the sixth N+ doped plate. According to another example embodiment, an anode 607 may be operably connected to the P+ doped plates 604, N+ doped plates 605, and gate structures 606 of one of the P-type wells 603a and a cathode 608 may be operably connected to the P+ doped plates 604, N+ doped plates 605, and gate structures 606 of the other of the P-type wells 603b.

The gate structures 606 which may be formed between the N+ doped plates 605 may include a gate oxide layer and a layer of polysilicon, where the polysilicon may be provided as a hard mask at ion implantation. The gate 606 may enable collective operation of the distributed N+ doped plates 605. Field-oxide film (FOX) portions 609 may be disposed adjacent to the surface of portions of the N-type well 602a-c and adjacent a distal end of each of the P+ doped plates 604. As can be seen from FIG. 6, multiple BJT transistors 610a, 610b (in this example there are four, two anode-side 610a and two cathode-side 610b) may be effectively formed by the provided structure. As shown, the collectors (denoted as "C" in FIG. 6) of the anode-side BJT transistors 610a and cathode-side BJT transistors 610b are effectively connected according to the depicted structure. Moreover, the bases (denoted as "B" in FIG. 6) of the anode-side BJT transistors 610a and cathode-side BJT transistors 610b are effectively connected to their respective P+ plates and the emitters (denoted as "E" in FIG. 6) of the anode-side BJT transistors 610a and cathode-side BJT transistors 610b are effectively connected to their respective N+ plates.

It will be understood that the configuration depicted in FIG. 6 and, indeed, configurations according to other embodiments which are not depicted, may function as two isolated low voltage NMOS which share a common N-type isolation region 301. That is, the substrate 600, the N+ buried layer 601, the N-the type well 602a, 602b, the P-type well 603a, along with the P+ plates 604, N+ plates 605, and, according to some embodiments, gate structures 606 associated with the P-type well 603a, may function as a first isolated low voltage NMOS 300a. Likewise, the substrate 600, the N+ buried layer 601, the N-the type well 602c, 602b, the P-type well 603b, along with the P+ plates 604, N+ plates 605, and, according to some embodiments, gate structures 606 associated with the P-type well 603b, may function as a second isolated low voltage NMOS 300b. The shared common N-type isolation region 301 thus comprises N-type well 602b. The gate, source, and drain of the isolated low voltage NMOSs 300a, 300b are denoted in FIGS. 6 through 8 as "G," "S," and "D," respectively.

As shown in FIGS. 7 and 8, respectively, during a positive ESD event, the anode-side transistors 610a may, in effect, operate as forward bias diodes 710a, and during a negative ESD event, the cathode-side transistors 610b may, in effect, operate as forward bias diodes 810b. Thus, during either a positive or negative ESD event, ESD current may be discharged by a forward bias diode and an NPN BJT at the same time.

The material of the N+ buried layer 601 may be N-epi, a deep N-type well, or multiple, stacked N+ buried layers. The P-type wells 603a, 603b may be stacked with a P-type well and P+ buried layer or a P-implant. The N-type wells 602a-c may also be an N-implant in some cases. The structure may be fabricated using any standard BCD process without additional masks. According to another example embodiment, the structure may be fabricated with a non-epitaxial process, such as a triple well process. The structure may also be fabricated with a single poly or double poly process. A local oxidation of silicon (LOCOS) process may be used in the fabrication of at least a portion of the structure, such as to fabricate the FOX portions 609. Alternatively, a shallow trench isolation (STI) process may be used, such as to fabricate at least a portion of the structure, such as the FOX portions 609.

FIG. 9 includes a topmost graph 900 illustrating the breakdown voltage characteristics of an example embodiment. As can be seen from the graph 900, the breakdown voltage may have an equal magnitude in the forward (positive) and reverse (negative) direction. The bottom graphs 910, 920 illustrate measured leakage current 911, 921 between the anode 607 and cathode 608, and measured ESD current 912, 922 of an example embodiment during positive and negative ESD stress experiments, respectively. As can be seen, the both of the measured ESD currents 912, 922 exhibit snap-back 931, indicating successful ESD protection in both the positive and negative direction.

Example embodiments may therefore provide a relatively small-sized bi-directional bipolar junction transistor (BJT) for high voltage electrostatic discharge (ESD) protection. Moreover, example embodiments may be applied to a standard BCD process without a requirement for use of additional masks. Embodiments may also be applied to different high voltage BCD processes and provide different operational voltage related ESD protection in the same process by providing a N+ buried layer or N-type well recipe. As such, high voltage ESD protection that is often required for devices that are to be used in high voltage settings that may encounter ESD events can be provided in a relatively small size and by a relatively low voltage MOS structure. Some embodiments could also be used for general DC circuit operation. Additionally, ESD protection may be provided for devices which require such protection to be bi-directional, such as in motor driver circuits. In this regard, embodiments may, for example, be operably connected between an input/output (I/O) pad and a power pad of the motor driver circuit so as to provide positive and negative high voltage ESD protection without causing irregular operation or inducing latch-up issues.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A bi-directional bipolar junction transistor (BJT) comprising:
    a p-type substrate;
    an N+ doped buried layer disposed adjacent to the substrate;
    a first P-type well region disposed adjacent to the N+ doped buried layer;
    a second P-type well region disposed adjacent to the N+ doped buried layer; and
    an N-type well region adjacent to the N+ doped buried layer and encompassing the first and second P-type well regions such that at least a portion of the N-type well region is interposed between the first and second P-type well regions;
    wherein the first P-type well comprises first, second, and third N+ doped plates, first and second P+ doped plates, and first and second gate structures, the first P+ doped plate being disposed adjacent to the first N+ doped plate, the first gate structure being interposed between the first and second N+ doped plate, the second gate structure being interposed between the second and third N+ doped plate, and the second P+ doped plate being disposed adjacent to the third N+ doped plate; and
    wherein the second P-type well comprises fourth, fifth, and sixth N+ doped plates, third and fourth P+ doped plates, and third and fourth gate structures, the third P+ doped plate being disposed adjacent to the fourth N+ doped plate, the third gate structure being interposed between the fourth and fifth N+ doped plate, the fourth gate structure being interposed between the fifth and sixth N+ doped plate, and the fourth P+ doped plate being disposed adjacent to the sixth N+ doped plate.

2. The bi-directional BJT of claim 1, further comprising first, second, and third field oxide (FOX) portions disposed adjacent to the N-type well region, the first FOX portion being further disposed adjacent to the first P+ doped plate, the second FOX portion being further interposed between the second and third P+ doped plate, and the third FOX portion being disposed adjacent to the fourth P+ doped plate.

3. The bi-directional BJT of claim 2, wherein the first, second, and third FOX portions are fabricated via a local oxidation of silicon (LOCOS) process.

4. The bi-directional BJT of claim 2, wherein the first, second, and third FOX portions are fabricated via a shallow trench isolation (STI) process.

5. The bi-directional BJT of claim 1, wherein the gate structures comprise a polysilicone layer.

6. The bi-directional BJT of claim 5, wherein the polysilicone layer is provided as a hard mask at ion implantation.

7. The bi-directional BJT of claim 1, wherein the N+ buried layer comprises an n-type epitaxial layer.

8. The bi-directional BJT of claim 1, wherein the N+ buried layer comprises a deep N-type well.

9. The bi-directional BJT of claim 1, wherein the N+ buried layer comprises a plurality of stacked N+ buried layers.

10. The bi-directional BJT of claim 1, wherein each P-type well comprises a stacked P-type well and P+ buried layer.

11. The bi-directional BJT of claim 1, wherein the P-type wells are fabricated via P-type implantation.

12. The bi-directional BJT of claim 1, wherein the N-type well region is fabricated via N-type implantation.

13. The bi-directional BJT of claim 1, wherein the bi-directional BJT is fabricated via a single poly process.

14. The bi-directional BJT of claim 1, wherein the bi-directional BJT is fabricated via a double poly process.

15. The bi-directional BJT of claim 1, wherein the bi-directional BJT is fabricated via a non-epitaxial process.

16. The bi-directional BJT of claim 15, wherein the non-epitaxial process comprises a triple-well process.

17. A circuit comprising a bi-directional high voltage electrostatic discharge (ESD) protection element, the bi-directional high voltage ESD protection element comprising:
    a p-type substrate;
    an N+ doped buried layer disposed adjacent to the substrate;
    a first P-type well region disposed adjacent to the N+ doped buried layer;
    a second P-type well region disposed adjacent to the N+ doped buried layer; and
    an N-type well region adjacent to the N+ doped buried layer and encompassing the first and second P-type well regions such that at least a portion of the N-type well region is interposed between the first and second P-type well regions;
    wherein the first P-type well comprises first, second, and third N+ doped plates, first and second P+ doped plates, and first and second gate structures, the first P+ doped plate being disposed adjacent to the first N+ doped plate, the first gate structure being interposed between the first and second N+ doped plate, the second gate structure being interposed between the second and third N+ doped plate, and the second P+ doped plate being disposed adjacent to the third N+ doped plate; and
    further wherein the second P-type well comprises fourth, fifth, and sixth N+ doped plates, third and fourth P+ doped plates, and third and fourth gate structures, the third P+ doped plate being disposed adjacent to the fourth N+ doped plate, the third gate structure being interposed between the fourth and fifth N+ doped plate, the fourth gate structure being interposed between the fifth and sixth N+ doped plate, and the fourth P+ doped plate being disposed adjacent to the sixth N+ doped plate.

18. The circuit of claim 17, wherein the bi-directional high voltage ESD protection element further comprises:
    an anode operably connected to the first, second, and third N+ doped plates, the first and second P+ doped plates, and the first and second gate structures; and
    a cathode operably connected to the fourth, fifth, and sixth N+ doped plates, the third and fourth P+ doped plates, and the third and fourth gate structures;
    further wherein the circuit comprises a motor driver circuit comprising an input/output (I/O) pad and a power pad, one of the anode or cathode of the bi-directional high voltage ESD protection element being operably connected to the I/O pad and the other of the anode or cathode of the bi-directional high voltage ESD protection element being operably connected to the power pad.

19. A semiconductor device comprising a first isolated low voltage n-channel metal oxide field effect transistor (LVNMOS) and a second isolated LVNMOS, wherein the first and second isolated LVNMOS share a common N-type well isolation region,
  wherein a first P-type well of the first LVNMOS comprises first, second, and third N+ doped plates, first and second P+ doped plates, and first and second gate structures, the first P+ doped plate being disposed adjacent to the first N+ doped plate, the first gate structure being interposed between the first and second N+ doped plate, the second gate structure being interposed between the second and third N+ doped late and the second P+ doped plate being disposed adjacent to the third N+ doped plate; and
  further wherein a second P-type well of the second LVNMOS comprises fourth, fifth, and sixth N+ doped plates, third and fourth P+ doped plates, and third and fourth gate structures, the third P+ doped plate being disposed adjacent to the fourth N+ doped plate, the third gate structure being interposed between the fourth and fifth N+ doped plate, the fourth gate structure being interposed between the fifth and sixth N+ doped plate, and the fourth P+ doped plate being disposed adjacent to the sixth N+ doped plate.

* * * * *

UNITED STATES PATENT AND TRADEMARK OFFICE
CERTIFICATE OF CORRECTION

| | | |
|---|---|---|
| PATENT NO. | : 9,054,524 B2 | Page 1 of 1 |
| APPLICATION NO. | : 13/656232 | |
| DATED | : June 9, 2015 | |
| INVENTOR(S) | : Chen et al. | |

It is certified that error appears in the above-identified patent and that said Letters Patent is hereby corrected as shown below:

<u>Column 9</u>

Line 13, Claim 19, "late" should read --plate--

Signed and Sealed this
Seventeenth Day of November, 2015

Michelle K. Lee
*Director of the United States Patent and Trademark Office*